United States Patent
Knoedl, Jr. et al.

[11] Patent Number: 5,966,055
[45] Date of Patent: Oct. 12, 1999

[54] PHASE-SHIFT MODULATION OF A DIRECT ANTENNA-DRIVING VCO

[75] Inventors: George Knoedl, Jr., Milford; David J. Thomson, Murray Hill, both of N.J.

[73] Assignee: Lucent Technologies, Inc., Murray Hill, N.J.

[21] Appl. No.: 08/799,164

[22] Filed: Feb. 14, 1997

[51] Int. Cl.[6] .................................................. H04L 27/20
[52] U.S. Cl. ........................ 332/103; 332/100; 332/127; 375/274; 375/279; 375/305; 375/308
[58] Field of Search .................................. 332/100, 101, 332/102, 103, 104, 105, 127, 128, 144, 146; 375/271, 272, 274, 279, 280, 281, 283, 302, 303, 305, 306, 308

[56] References Cited

U.S. PATENT DOCUMENTS

| | | | |
|---|---|---|---|
| 4,021,757 | 5/1977 | Nossen | 332/101 |
| 4,546,331 | 10/1985 | DaSilva et al. | 332/128 |
| 5,311,152 | 5/1994 | Lautzenhiser | 332/127 |
| 5,313,173 | 5/1994 | Lampe | 332/103 |
| 5,617,084 | 4/1997 | Sears | 340/870.02 |

FOREIGN PATENT DOCUMENTS

| | | |
|---|---|---|
| 0 408 238 A2 | 1/1991 | European Pat. Off. . |
| 0 610 995 A2 | 8/1994 | European Pat. Off. . |
| 2 250 648 | 10/1992 | United Kingdom . |

*Primary Examiner*—Siegfried H. Grimm

[57] ABSTRACT

Apparatus for generating the family of PSK (phase shift keyed) modulations, which include BPSK (binary PSK), QPSK (quaternary PSK), MSK (minimum shift keying) and the like. The carrier is generated with the desired digital information already phase-modulated onto it by directly introducing a phase shift or delay onto the error path of a phase-locked loop. causing the phase-locked loop to create the phase modulation. The [proposed scheme differs from common practice approaches, which are usually implemented by linear synthesis (an AM technique); rather, it] invention employs direct nonlinear synthesis (an FM technique). The invention [yields good phase precision with arbitrary spectral shaping under the constraint of constant envelope signaling. It] permits the connection of the output of a simple, inexpensive VCO (voltage controlled oscillator) directly to a system's antenna without the need for intervening circuit elements such as phase splitters, mixers, and the like which is applicable to [. The resulting minimal implementation will lend itself well to] the power, size and cost constraints of a microminiature radio transmitter as might be required, for example, for the up-link of a wristphone style communicator.

24 Claims, 7 Drawing Sheets

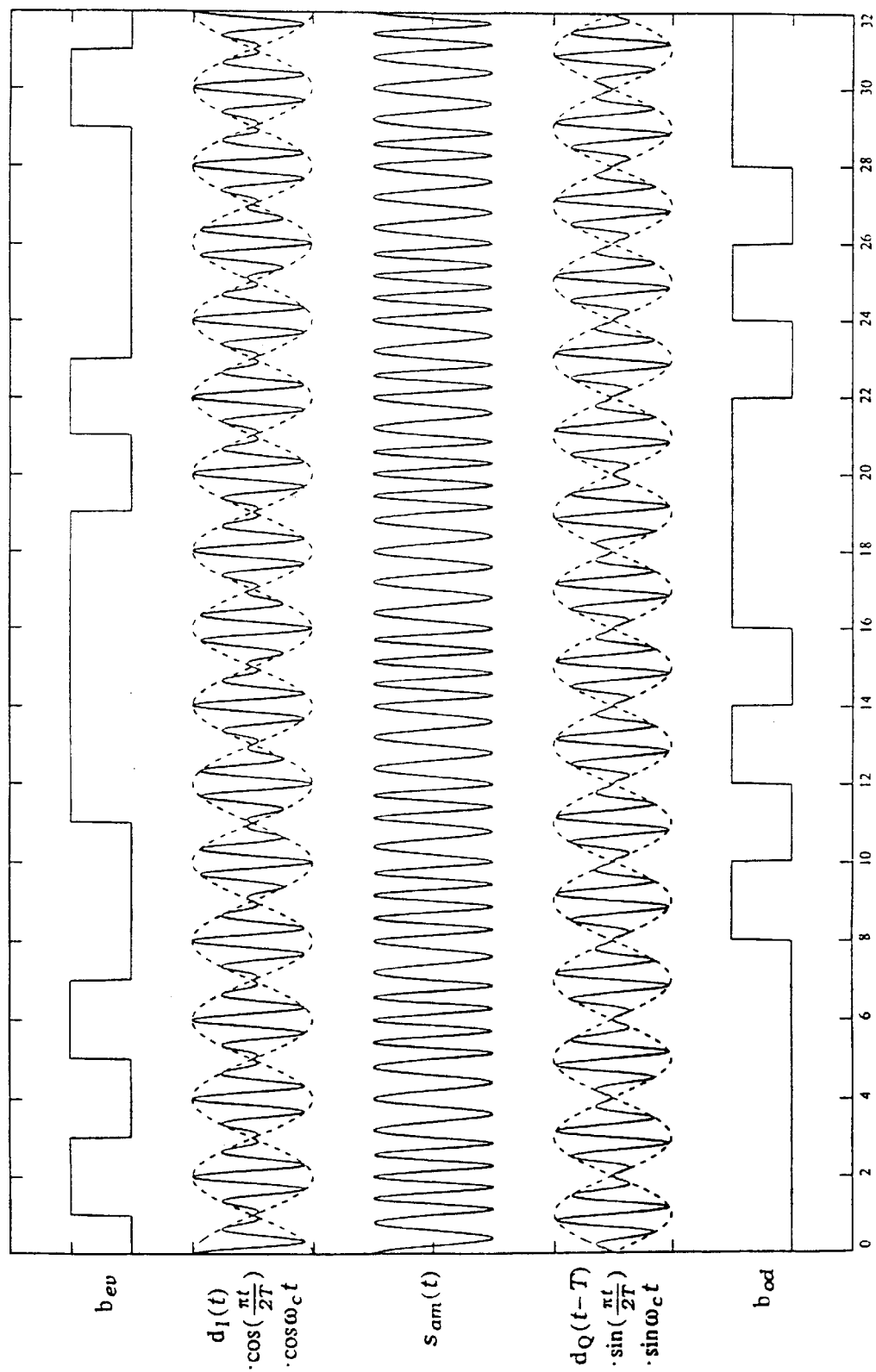
Figure 1 Construction of MSK modulation by linear synthesis

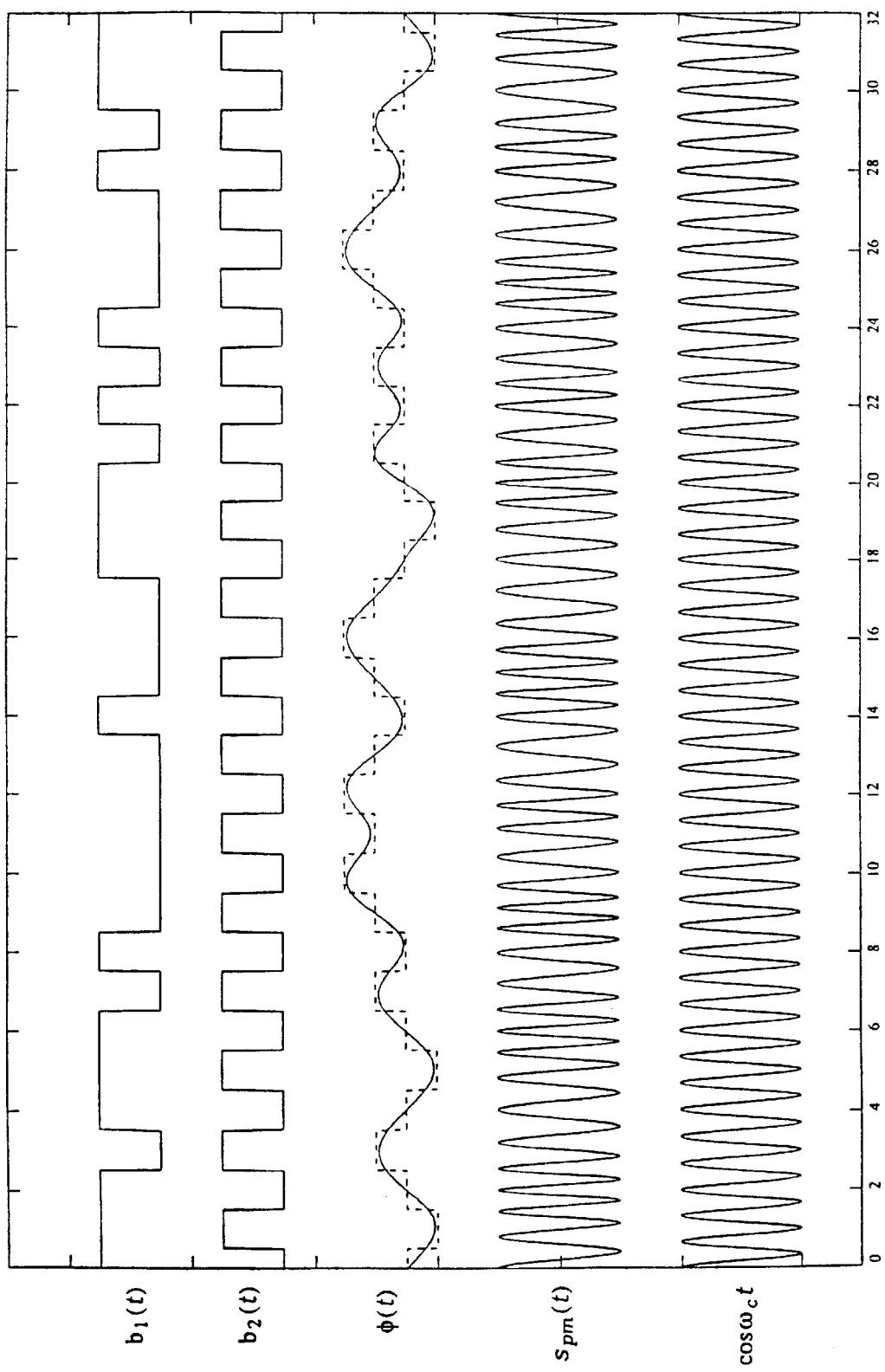
Figure 2 Construction of MSK modulation by non-linear synthesis

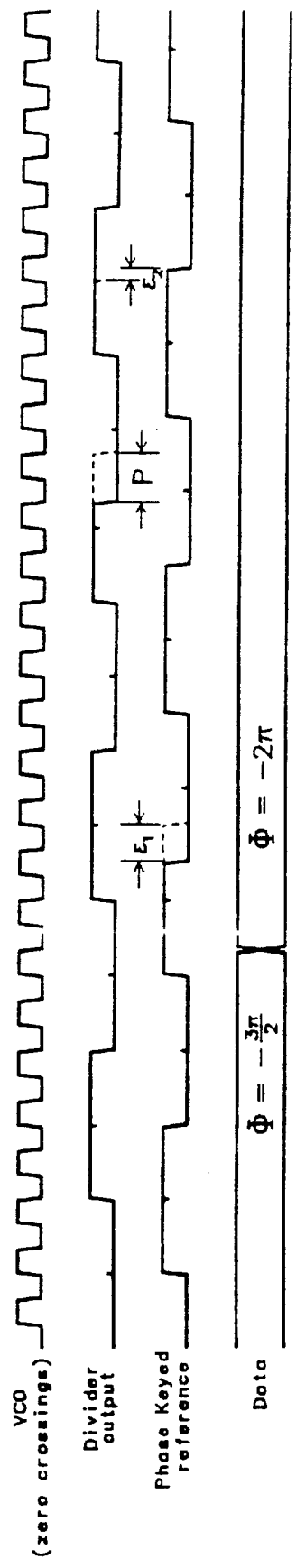
Figure 11 Timing diagram illustrating introduction of keyed phase into a PLL

PHASE-SHIFT MODULATION OF A DIRECT ANTENNA-DRIVING VCO

FIELD OF THE INVENTION

The invention pertains to the field of radio transmission circuits. More particularly, the invention pertains to a Voltage Controlled Oscillator (VCO) especially suitable for microminiature radio transmitters.

BACKGROUND OF THE INVENTION

In an application such as a wrist telephone, where space and available power are severely limited, one is compelled to minimize the amount of circuitry used to perform the intended function. One must attempt to get as much functionality as possible from that circuitry that is included. This design philosophy was practiced in the early days of electronics—although at that time for economic reasons, where active devices, namely vacuum tubes, were at a premium. Though this philosophy is, to a large extent, incommensurate with robustness of design, it appears in this instance to be a necessary evil. In conceding, howeaer, one must be judicious in making design choices to arrive at an optimal compromise.

A microwave radio transmitter that will operate from coin or button cells will be necessarily limited to developing signal strengths in the order of only a milliwatt. Since it takes at least this much signal power to drive a microwave modulator or mixer, most local oscillators are designed to develop this much power.

For these reasons, plus to keep component count and power consumption small, and to avoid conversion loss and the need for subsequent amplification, there is strong impetus in the present application to avoid the use of such modulators. It is preferable to drive the antenna directly by the oscillator with no intervening circuitry. Even the output filter can be avoided provided the oscillator can be designed to exhibit adequate spectral purity to keep harmonics at or below an acceptable level.

To transmit at the correct frequency the oscillator, typically a voltage controlled oscillator (VCO), must be locked to a stable frequency reference. This is for removing frequency drift or uncertainty due to variations in circuit parasitics, or changes in temperature, etc. A phase locked loop (PLL), usually employed for this purpose, is essential. The PLL will also prevent the VCO frequency from de-tuning due to unavoidable changes in antenna loading that are likely to occur with a portable device.

The question arises: How do we modulate the carrier?

A. Selecting a Modulation Format

A.1 On/Off Keying: The VCO could be keyed on and off—an amplitude modulation (AM) scheme—however two problems would arise from this. First, on/off keying (OOK) leaves half of the RF (radio frequency) power in the unmodulated carrier. With such minuscule transmitted power in our application, the signal received at the base station will be extremely weak. There is great concern for the ability to detect this signal in the presence of noise therefore, we don't want to waste any. Second, each time the VCO is turned off then back on again, the PLL will need to re-acquire phase lock. This can cause the system to produce energy at undefined frequencies outside the assigned channel during re-acquisition and, depending upon how long re-acquisition takes, can severely limit the keying rate achievable.

A.2 Frequency Modulation: A VCO may easily be frequency modulated simply by applying the modulating signal to its control port. Frequency modulation (FM) and phase modulation (PM) are essentially very similar and typically yield waveforms of constant amplitude as do their digital counterparts, frequency shift keying (FSK) and phase shift keying (PSK). Unfortunately, with currently available discriminators, wideband FM results in a significantly higher symbol detection threshold than does AM—typically between 10 and 20 dB, depending upon modulation index. For a given transmitted power, this impairment translates immediately into one of reduced signaling range.

A.3 Phase Shift Keying: The most efficient modulation schemes, in terms of symbol detection threshold and bandwidth utilization are the phase shift keying (PSK) schemes. These include binary phase shift keying (BPSK), quaternary phase shift keying (QPSK), staggered or offset quaternary phase shift keying (OQPSK), minimum shift keying (MSK), and sinusoidal frequency shift keying (SFSK)—the latter four having at least a 2:1 signaling-rate-to-bandwidth advantage over BPSK. Intrinsically, they are all constant envelope modulations.

When BPSK and QPSK signals are band limited at the transmitter to reduce their excess sideband energy, their envelopes acquire amplitude variations. There is the concern that nonlinearities in the amplifiers at the receiver or limiters at repeaters can restore the constant amplitude and, along with it, the undesirable excess sideband energy that can interfere with adjacent channels. OQPSK limits inter-symbol phase transitions to ±90°, reducing the above tendency somewhat. MSK and SFSK inherently reduce the occupied spectral bandwidth by making these phase transitions continuous.

MSK and SFSK are very similar to OQPSK. They all share having their inter-symbol phase transitions limited to ±90°. They differ from OQPSK primarily in the shaping of the applied modulation signaling bits to yield differing spectral roll-off rates. OQPSK, MSK and SFSK all exhibit the same $E_b/N_o$ (energy per symbol to noise energy ratio) thresholds for a given bit error rate (BER) as BPSK and QPSK do. I shall refer to OQPSK, MSK and SFSK, as well as the remainder of the general class simply as the SQPSKs (staggered quadrature phase shift keyed).

B. Selecting a Modulation Technique

B.1 Linear Synthesis: PSK may be implemented by either linear or nonlinear modulation techniques. Most implementations that appear in the literature are synthesized as linear modulation—an AM technique. FIG. 1 indicates the construction of MSK waveforms by linear synthesis, for the bit sequence ($b_{ev}$, $b_{od}$) indicated and as described in the following equation:

$$S_{am}(t) = d_I(t) \cdot \cos\left(\frac{\pi}{2T}t\right) \cdot \cos\omega_c t + d_Q(t-T) \cdot \sin\left(\frac{\pi}{2T}t\right) \cdot \sin\omega_c t$$

where: t is time;

$\omega_c$ is the carrier frequency;

T is the input signaling bit interval;

$b_{ev}$ and $b_{od}$ are the Boolean signaling bits to be transmitted, taking on the values 0 or 1;

$d_I = 2b_{ev} - 1$ and $d_Q = 2b_{od} - 1$, each valid for 2T seconds with the $d_Q$ transitions offset from those of $d_I$ by T seconds, are antipodal signals taking the values ±1; and $S_{am}(t)$ is the modulated carrier.

Linear synthesized PSK as suggested by Sam(t) above would require a phase splitter to generate in-phase and quadrature (I and Q) carrier signals, followed by modulator elements (mixers), a combiner, plus an amplifier to regenerate the signal, all between the oscillator and the antenna. It is these excess elements we are seeking to avoid.

B.2 Nonlinear Synthesis: FIG. 2 indicates the construction of MSK-like waveforms by nonlinear synthesis as described in the following equation for the same data as used to generate FIG. 1.

$$S_{pm}(t) = \cos[\omega_c t + \phi(t)] = \cos\left[\omega_c t + \left[b_1(t) \cdot \pi + b_2(t) \cdot \frac{\pi}{2}\right] * g(t)\right]$$

where:

$b_1$ and $b_2$ are modulator control bits (all data is in $b_1$:$b_2$ simply toggles the phase between I and Q), each valid for T seconds, derived from the signaling bit sequence listed earlier to yield the same modulated carrier phase sequence that $S_{am}(t)$ does in FIG. 1;

$g(t)$ is the impulse response of the pulse shaping function—usually a lowpass filter, (note that the asterisk preceding $g(t)$ is intended to indicate convolution); and $S_{pm}(t)$ is the modulated carrier.

The waveform $\Phi(t)$ shown in the figure is the modulation phase resulting from the bit pair sequence $\{b_1,b_2\}$, after being smoothed by the band limited response of the phase locked loop, $g(t)$. Note the similarity of the modulated carrier waveforms $S_{am}(t)$ and $S_{pm}(t)$ in FIGS. 1 and 2 respectively.

The generation of the modulator control bits $b_1$ and $b_2$ is indicated in FIG. 3. For comparison, offset signaling bits $d_I$ and $d_Q$ from the previous example are shown here also.

This latter function $S_{pm}(t)$, implies nonlinear synthesis—an FM or PM technique—and is amenable to implementation with a direct connected VCO.

SUMMARY OF THE INVENTION

The invention presents a simple implementation of a method for generating the family of PSK (phase shift keyed) modulations, which include BPSK (binary PSK), QPSK (quaternary PSK), MSK (minimum shift keying) and the like. In particular, it describes a new approach wherein the carrier is generated with the desired digital information already phase-modulated onto it. The proposed scheme differs from common practice approaches, which are usually implemented by linear synthesis (an AM technique); rather, it employs direct nonlinear synthesis (an FM technique).

The invention yields good phase precision with arbitrary spectral shaping under the constraint of constant envelope signaling. It permits the connection of the output of a simple, inexpensive VCO (voltage controlled oscillator) directly to a system's antenna without the need for intervening circuit elements such as phase splitters, mixers, and the like. The resulting minimal implementation will lend itself well to the power, size and cost constraints of a microminiature radio transmitter as might be required, for example, for the up-link of a wrist-phone style communicator.

BRIEF DESCRIPTION OF THE DRAWING

FIG. 1 shows the waveforms involved in MSK modulation by linear synthesis (prior art).

FIG. 2 shows the waveforms involved in MSK modulation by non-linear synthesis.

FIG. 3b shows a partial schematic of a circuit which could be used to generate control bits $b_1$ and $b_2$ as shown in FIG. 3a.

FIG. 11 shows a timing diagram illustrating the introduction of keyed phase into a phase-locked loop.

DESCRIPTION OF THE PREFERRED EMBODIMENT

Figure 3A:
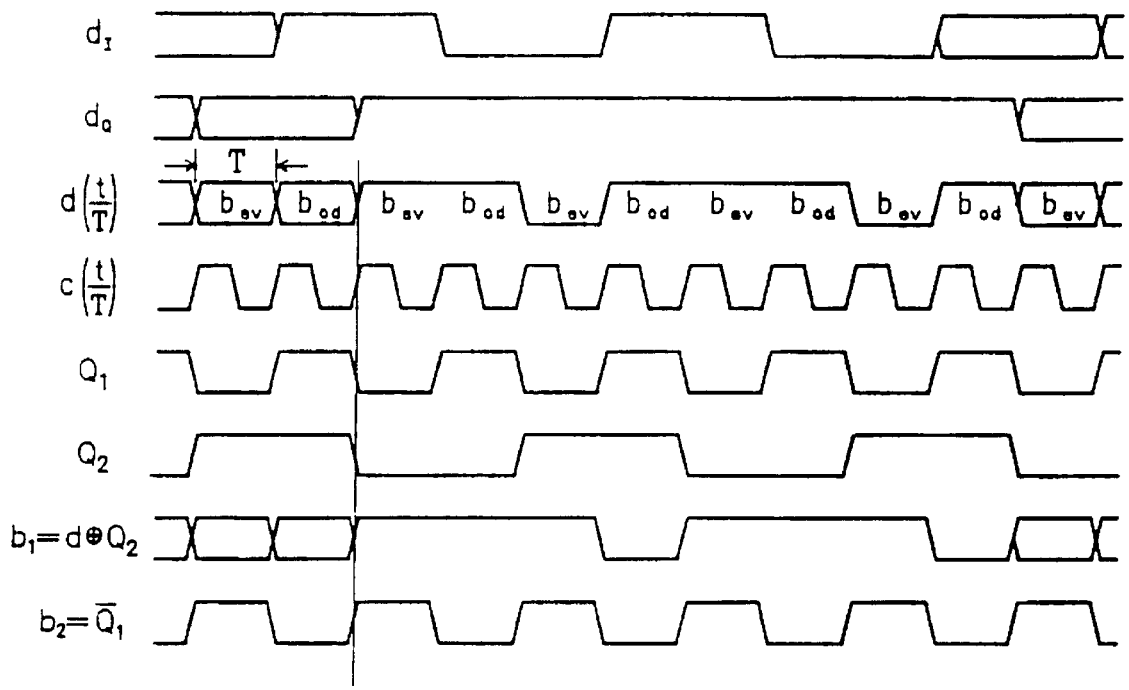
FIG. 3a shows the waveforms involved in the generation of control bits $b_1$ and $b_2$.
Figure 3B:
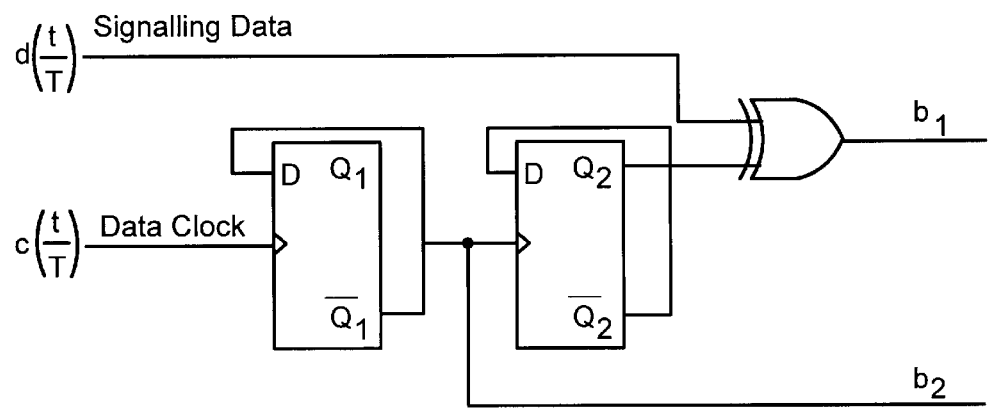
Figure 4:
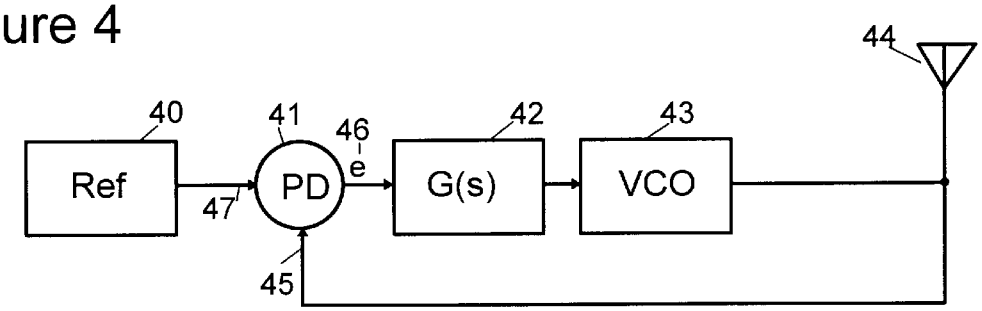
FIG. 4 shows a block diagram of a simple phase-locked loop direct antenna connected VCO-type transmitter.

Consider the simple phase-locked loop PLL) controlled transmitter of FIG. 4. The PLL comprises a reference oscillator (40), a phase detector (PD) (41), and a filter (G(s))(42). The antenna (44) is directly driven by a voltage-controlled oscillator (VCO)(43). The output (47) of the reference oscillator (40) and a portion of the output (45) of the VCO (43) are the inputs to the phase detector (41), the output (46) of which is the input to the filter (42). The frequency of the VCO (43) is controlled by the output voltage from the filter (42).

It should be noted here that the term "phase-locked loop", as used in this specification, is intended to include both phase-locked and frequency-locked loops, both being oscillators whose frequency is controlled by a feedback path using an error voltage which varies based on the difference between the output and a reference.

The phase detector (41) may be a pure phase detector, or a phase-frequency detector, within the teachings of the invention.

Figure 5:
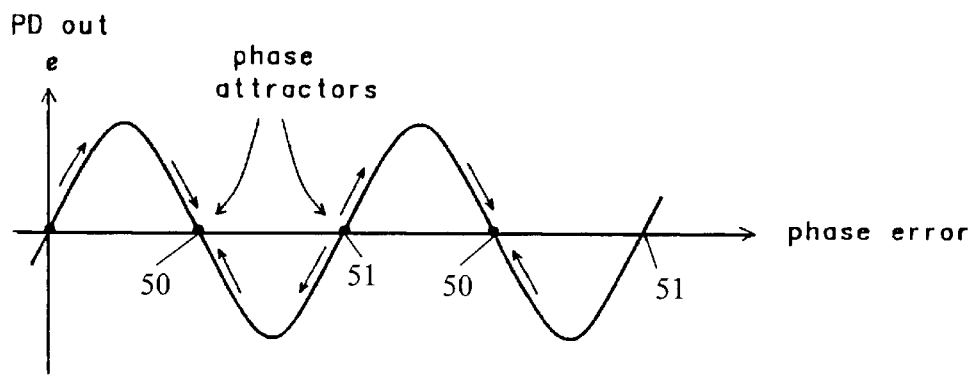
FIG. 5 shows a graph of phase detector output vs. phase error for a phase-locked loop.

The error term e at the output (46) of the phase detector (41), as a function of phase difference between the VCO and the reference for most common PD types, will be a periodic waveform with positive going and negative going zero crossings, as shown in FIG. 5. The zero crossings (50) on one slope will form stable attractors, while those (51) for the other will form unstable attractors. The PLL will "pull in" on a stable attractor, thus defining the steady state phase relationship between the VCO and the reference.

Figure 6:
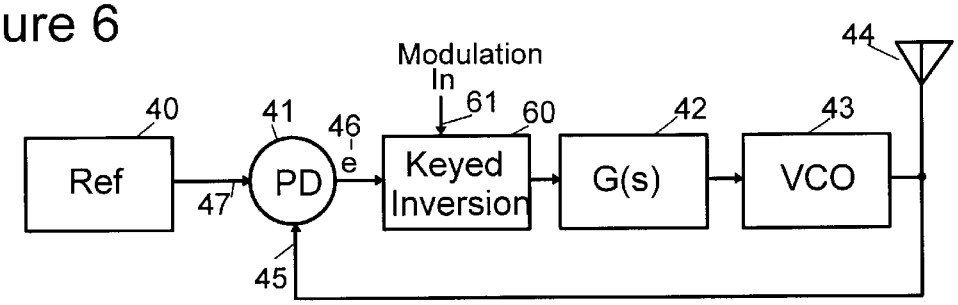
FIG. 6 shows a block diagram of a phase-locked loop transmitter with keyed inversion introduced.

If a 180° signal inversion (n radians) (60) is introduced between the PD (41) and the PLL loop filter (42), as indicated in FIG. 6, the PLL attractors will swap roles and force the VCO (43) phase to shift by 7. Thus the VCO can effectively be BPSK modulated by keying (61) the inversion in and out. Introducing the keyed signal inversion at either of the PD input legs (45) or (47) would yield the same effect.

In principle, the correction voltage right at an unstable attractor is zero. Therefore in practice, if the PLL state is placed here, this state may linger for some time before the VCO phase correction begins or might possibly get hung here. For this reason, in an actual design it would be best to avoid step changes of 180° operation.

It should be apparent that any arbitrary phase shift $\Phi$ may be effected in a similar manner by substituting a network with the desired phase shift, e.g. 90° or $\pi/2$ for QPSK or MSK, in place of the signal inversion shown in FIG. 6.

Figure 7:
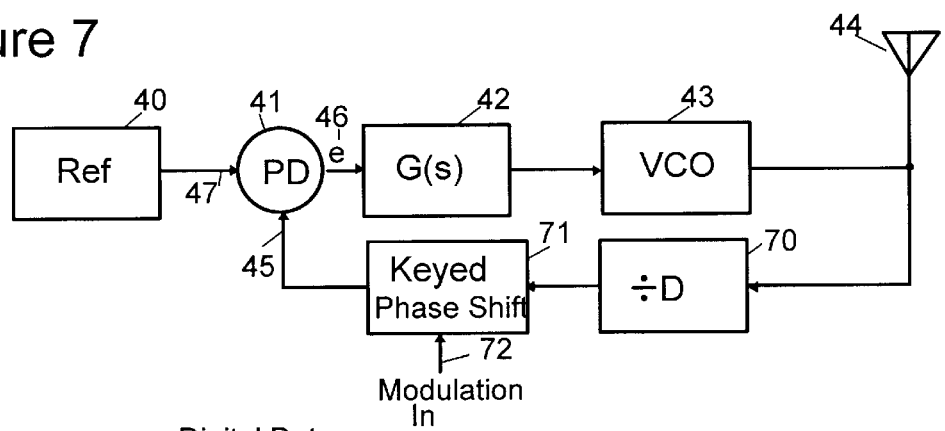
FIG. 7 shows a block diagram of a phase-locked loop transmitter with keyed phase shift and frequency divider introduced.

FIG. 7 shows that in a frequency synthesizer, a programmable divider (70) with division factor D is introduced into the PLL feedback path (45) to define the VCO (43) frequency with respect to the reference (40). The reference (40) is typically a fixed frequency, which is lower than the VCO (43) output (44). This permits the VCO output frequency to be controllably varied such that $$\omega_{vco} D \cdot \omega_{ref}$$

With the divider present, a phase shift of θ introduced at the PD (41) will cause a phase shift of D·θ, or, more precisely if introduced abruptly, $[D \cdot \theta]_{MOD\ 2\pi}$ at the VCO. If D is an odd integer, the net change at the VCO for a signal inversion will still be π. Unfortunately, D changes dynamically between odd and even as part of normal synthesizer operation.

We could avert the ambiguity resulting from the changing division factor D by introducing the phase shift between the VCO (43) and the divider (70). A phase shift introduced before the divider would not be altered by the factor D. But introducing the phase shift here would require its implementation at high frequencies with all of the attendant difficulties. Hence to guarantee π, or for that matter any arbitrary phase Φ at the VCO output, and retain simplicity, the phase shift of θ=Φ/D should be introduced at one of the PD inputs (45) or (47).

With θ held constant, changes in D can cause errors in Φ, the resultant phase modulated onto the carrier. When the band of interest is small compared to the carrier frequency, as might be typical, D needn't change much. Small relative changes in D yield only small errors in modulated phase.

$$\left| \frac{\Delta D}{D} \right| \ll 1 \rightarrow \left| \frac{\Delta \phi}{\phi} \right| \ll 1$$

Note that an arbitrary phase shift could be introduced at the PD output but, because, the PD output is at dc (zero frequency), I and Q signal channels and a vector phase shifter would be needed (to distinguish between positive and negative frequencies). This would spoil the simplicity of this scheme. When introduced at the PD inputs, a scalar phase shifter will suffice.

A Simple Phase Shifter

A simple low-pass R-C "el" network with the transfer function $$F(i\omega) = \frac{1}{1 + i\omega RC}$$

will exhibit a phase shift given by $$\theta = -\tan^{-1}(\omega RC)$$

The amount of phase shift we need to introduce at the PD is θ=Φ/D. For a carrier frequency of 2 GHz and a channel spacing of say 10 kHz, which defines the reference frequency at this value, D=200,000. For a VCO phase shift of $$\phi = \frac{\pi}{2}, \theta = \frac{\pi}{400{,}000}$$

a very small number, which may seem difficult to implement accurately.

The phase shift may be thought of as a phase delay, $$\Delta \tau = \frac{\theta}{\omega_{ref}} = \frac{\phi / D}{\omega_c / D} = \frac{\phi}{\omega_c},$$

which, when viewed as such, remains the same at either side of the divider.

At a VCO frequency in the range of 2 GHz, a π/2 phase shift represents a phase delay of Δτ=125 ps. Clearly this very small time constant would require unrealistic component values to achieve. Note, however, that for phase modulation we need concern ourselves only with the change in phase. Hence the keying needs only to effect a differential phase shift. A total phase delay of τ=100 ns, for example, can be realized with reasonable values and may be changed differentially by altering either R or C by some amount.

The nominal value of τ=100 ns may seem large compared to the Δτ=125 ps keying; even small drifts in the nominal value might be expected to introduce substantial changes in phase. But because only the change in phase θ comprises the modulation, the total phase shift Θ of the network is immaterial.

Variations in Θ, even if large compared to the keyed phase shift θ, don't impact the accuracy of the modulation. A receiver has no way of determining the transmitter's ultimate source reference phase, nor will this matter to it. The receiver needs only the relative reference phase implicit in the modulated carrier. Therefore Θ may be thought of as a fixed pedestal onto which the modulation θ is built. Provided any drift in this pedestal phase is slow compared with the keying rate, it shouldn't affect the receiver's ability to detect the signal correctly.

Choosing the Nominal Pole Frequency for the Phase Network

So long as the reference frequency is fixed, the choice of nominal pole frequency is somewhat arbitrary, provided it is high enough to pass $\alpha_{ref}$. (se of an all-pass structure would remove this latter constraint.)

On occasion an application is encountered where the reference frequency is made variable. For minimal variance of differential phase shift over frequency, the optimal placement of the nominal pole frequency will be at the average reference frequency, $$\frac{1}{RC} \approx \langle \omega_{ref} \rangle.$$

Over a broad frequency range more than one pole may be required to hold differential phase invariant. Techniques akin to those used in realizing constant phase difference networks can be useful for determining the pole frequencies required and how to distribute them in two paths to realize effective right half plane poles.

Keying in the Phase Shift

Figure 8:
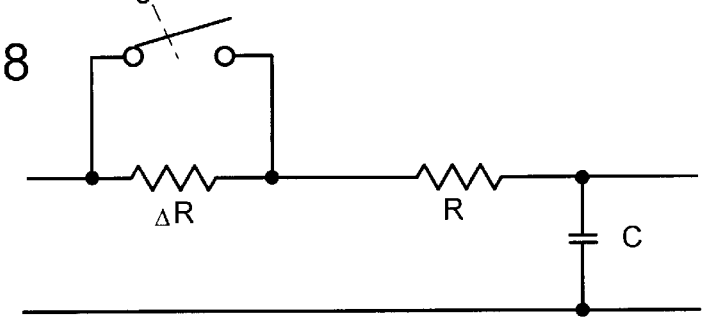
FIG. 8 shows a partial schematic of a simple R-C phase shift network with keyed differential phase.

In the circuit of FIG. 8 the value of R can be altered in response to the modulation keying information. When operated at the reference frequency $\omega_{ref}$, which is presented at the PD inputs, the keyed network will yield a differential phase shift of $$\theta = \Delta\Theta = -\tan^{-1}[\omega_{ref} RC] + \tan^{-1}[\omega_{ref}(R - \Delta R)C]$$

By providing two keying points on the phase shift network we can introduce keyed differential phase shifts of $$\theta_1 = -\frac{\pi}{D} \text{ and } \theta_2 = -\frac{\pi}{2D}.$$

These two shifts may be keyed separately or in combination, the four possible combinations of which will yield the four values of modulation phase required to generate the SQPSKs, $$\phi = \left\{0, \frac{\pi}{2}, \pi, \text{ and } \frac{3\pi}{2}\right\}.$$

A Realizable Phase Keyer

Figure 9:
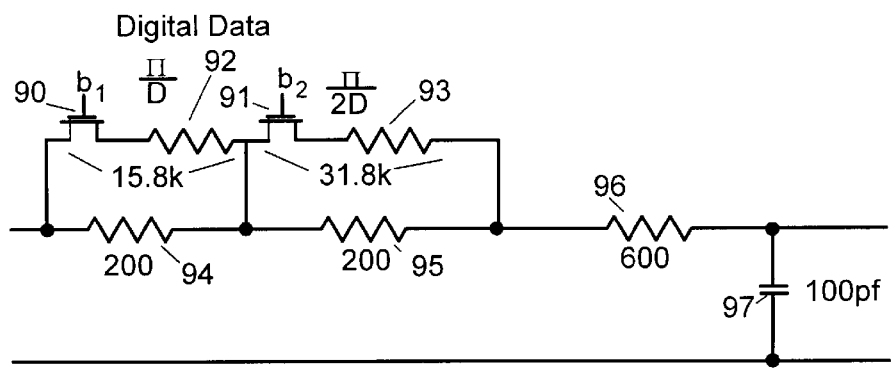
FIG. 9 shows a partial schematic of a field-effect transistor keyed differential phase shift network.

The circuit of FIG. 9 is a practical design of the differential phase shift keyer suitable for the invention. It uses one capacitor (97), five resistors (92) to (96) and two field effect transistors (FETs) (90) and (91). The first FET (90) keys a small effective ΔR by shunting somewhat larger valued resistor (92) across resistor (94). Similarly, second FET (91) keys ΔR/2 by shunting resistor (93) across resistor (95). This helps make it tolerant of the finite $R_{Ds}$(on) (the FET channel "on" resistance) of the keying elements. It is tolerant to large variations in $R_{Ds}$(on) because of this also.

For C=100 pf, $R_{tot}$=1 kΩ and a PD input frequency of 10 kHz, effective ΔRs of 1.25Ω and 2.5Ω respectively, will provide differential delays of 125 ps and 250 ps. At a carrier frequency of 2 GHz, this will modulate phases of π/2 and π, respectively, onto the VCO. A modulated phase of $$\frac{3\pi}{2}$$

can be achieved by keying them both; 0 results with neither keyed.

Phase Keying by Error Voltage Perturbation

Figure 10:
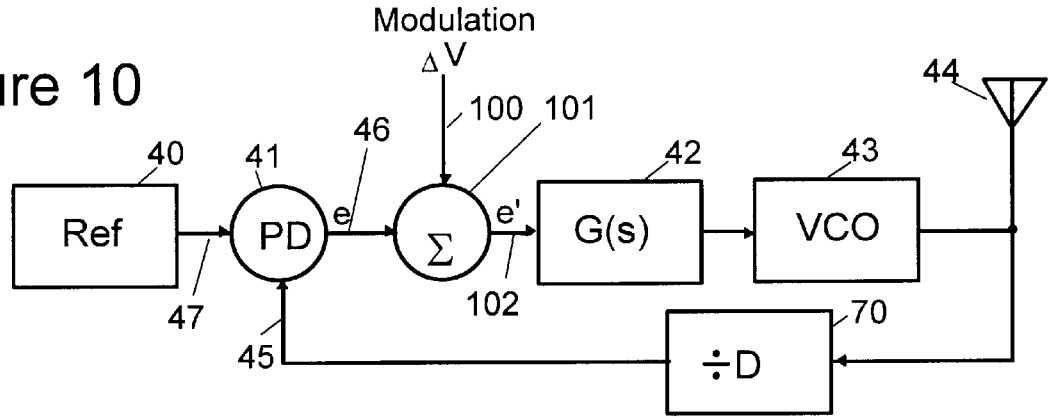
FIG. 10 shows a block diagram of a phase-locked loop transmitter with keyed error perturbation.

As an alternative to keying phase with a switchable phase shift network, phase keying may also be achieved by injecting a voltage perturbation (101) into the error path (46) (101) (102) of the PLL, as shown in FIG. 10.

This can be particularly easy for small changes in phase at the PD output as will be the case for large frequency divider ratio D. The change in apparent error voltage e'=e+ΔV applied to the VCO (43) will induce the PLL to readjust its phase in such a way as to null the injected perturbation.

If G(s) (42) is essentially an integrator, e' (102) will approach zero. This will allow a finite error voltage e=e'-ΔV to exist at the PD (41) output (46). If the phase-to-voltage transfer gain, θ(υ)=γ·ΔV of the PD is known and repeatable, this will permit a controllable adjustment to the PLL output phase.

$$\Phi=\theta(\upsilon)D=\gamma\cdot\Delta V_{applied}\cdot D$$

where, preferably:

$$\gamma = \frac{\theta_{max} - \theta_{min}}{V_{max} - V_{min}}$$

[radians/volt] is a constant.

The keyer may take the form of a FET keyed voltage divider, somewhat similar in form to the phase keyer of FIG. 9, driven from a fixed dc reference voltage.

Digital phase detectors are usually duty ratio devices which exhibit linear transfer gain. The output of the digital phase detector dithers between two states as a function of applied phase difference. If known reference potentials are transmitted for each of these two states, then the average output voltage will be a known linear function of phase difference. A CMOS (complementary metal oxide semiconductor) device, for example will transmit the power rail potentials. The range of applied phase difference that causes a shift in duty ratio of from 0% to 100% is a function of topology of the particular phase detector, but most cover a range of at least—radians of phase difference.

Accommodating Cumulative Phase

While in the SQPSKs the phase shift during a single signaling transition is restricted to $$\pm\frac{\pi}{2},$$

the cumulative phase of the modulated carrier due to a number of phase transitions is not restricted to the range 0 to 2π. There is no constraint on the data to prevent the modulated carrier phase from wandering indefinitely. No finite length keyed phase shifter alone will be able to accommodate this situation. Therefore, another means must be provided for producing cumulative phase that wanders beyond the keyer's range.

Consider the situation where the VCO phase in the present signaling bit interval is at $$\Phi = -\frac{3\pi}{2}$$

and is about to change by $$\phi = -\frac{\pi}{2}$$

to become Φ=−2π=0. Note: whether the resulting modulated phase is positive or negative depends upon whether the phase keyer is introduced into the feedback or reference path to the PD.

FIG. 11 is a timing diagram that illustrates this event for a division factor D=6. To facilitate clear illustration of timing relationships, although in practice they will generally not be, all waveforms are shown here as square waves. The tick marks at the mid-points of the reference and divider waveforms indicate the e=0 points of the PD output. In steady state the PLL will seek to align these points with the transitions of the complementary waveform.

The keyer does not have $$\theta = -\frac{2\pi}{D}$$

available, and so must switch to θ=0. Immediately after the data transition, the phase error jumps to $$\varepsilon_1 = \frac{3\pi}{D}.$$

If no other action is taken, the PLL will seek to force ε→0, passing through $$\frac{\pi}{D} \text{ and } \frac{\pi}{2D}$$

along the way. This will cause the modulated carrier phase to pass "the long way 'round the circle", through phases −π and $$-\frac{\pi}{2},$$

which can result in undesirable excess sideband spreading of the transmitted signal and may possibly cause detection errors at the receiver.

If at about the same moment the differential phase shift of $$\frac{3\pi}{2D}$$

is keyed, one count is subtracted from the divider index (for just one divider count cycle), the divider output will shift its phase by $$\frac{2\pi}{D},$$

leaving the net phase error $$\varepsilon_2 = -\frac{\pi}{2}.$$

The PLL can then proceed to force this error to zero directly.

In general, to accommodate arbitrary data sequences which can result in indefinite phase accumulation, and to restrict phase changes to $$\pm\frac{\pi}{2},$$

each time the keyed phase rolls over from $$-\frac{3\pi}{2}$$

to 0 or from 0 to $$-\frac{3\pi}{2},$$

one count must be suppressed from or stuffed into the divider, respectively.

Band Limiting the Modulation

To minimize interchannel interference, it is desirable to restrict the energy in the sidebands of the modulated carrier. Given the size and efficiency constraints for the embodying system, it is imperative that we avoid the use of post modulation filters.

While in the invention the digital modulation information $\{b_1, b_2\}$ may be injected into the PLL as a sequence of step functions, the spectral bandwidth of the resultant phase modulated carrier at the VCO output will be inherently restricted to the frequency response imposed by the phase locked loop. By tailoring the PLL response, the effective modulation pulse shape, and hence the modulated carrier's spectral properties, can be adjusted as desired.

If the PLL response to phase change requests. is, for example, optimized for fastest step response, the resulting modulation and its spectrum will approach that of OQPSK. A PLL response that approaches an ideal low pass filter with a corner frequency at $f_p=1/2T$ will cause the modulated phase to vary sinusoidally and will result in a modulation and spectrum that approaches that of SFSK.

Non-linear PLL responses are also acceptable. For example, application of a slew limited phase change request will result in a modulation and spectrum identical to that of MSK.

Among the factors affecting the PLL response is its loop filter. The loop filter in the PLL serves a number of purposes. It filters the PD output to suppress the $2\omega_{ref}$ term, it provides gain to diminish the phase error, and it compensates the control loop to ensure stability. Otherwise, it is a free variable that may be used to shape the loop response as required to achieve the desired spectrum for the modulated carrier. Any order loop filter may be used provided appropriate lead compensation is applied at gain crossover to ensure loop stability.

Signaling Rate Limitations

In the invention, the phase shifter is introduced at the PD input where the frequency presented, $\omega_{ref}$ is typically 2π·30 kHz or less. This can bring advantage and disadvantage. The phase shifter will be easy to implement in this frequency range. However, since the signaling is introduced into the control loop of the PLL, the maximum signaling rate will be limited to the bandwidth (BW) of the PLL.

This may not be as restrictive as might seem at first glance. Although the loop filter must have a corner frequency below $2\omega_{ref}$, the closed loop response of the PLL can still, by virtue of its loop gain and the resulting pole relocation, have a frequency response beyond $2\omega_{ref}$.

Another concern relates to the Q (quality factor) of the elements in the VCO itself To attain spectral purity, i.e. to minimize 1/f-like carrier noise, one tries to achieve as high a Q as is possible in the oscillator. Such a high Q would imply limited BW and hence one might expect limited response to commands to shift oscillation frequency or phase.

$$BW = \frac{f_c}{Q}$$

where: $f_c$ is the frequency of oscillation.

This would certainly be true of a driven filter of comparable Q. If one attempted to change the drive frequency abruptly, the accumulated energy in the filter would cause the output to persist in its current dynamic state until that energy was dissipated.

In a VCO however, one needn't wait for the energy to dissipate before realizing a change in frequency because, in controlling it, one shifts the eigenvalues (pole positions) of the oscillator. Since altering the eigenvalues does not couple energy into or out of the eigenstates, this may be accomplished as abruptly as desired. The accumulated energy continues to shuttle around as before, but at an altered rate. Hence the FM bandwidth of a VCO needn't be limited by the Q of its frequency determining elements.

Unexpected Effects on Modulated Carrier Bandwidth

In linear synthesized MSK the bandwidth of the modulation applied to transmit a bit stream at rate 1/T need only be 1/4T. This is because two signals, each at bit rate 1/2T, are being applied to two orthogonal channels. According to Nyquist's theorem, the highest signal frequency that can be synthesized by a sampling rate of $f_s=1/2T$ is $f_s/2=1/4T$ This results in a modulated carrier sideband bandwidth substantially approaching 1/4T.

There is no such orthogonal channel pair in nonlinear synthesis, so a bit stream at rate 1/T must be applied to the modulator with a bandwidth of 1/2T. But as it turns out, with nonlinear synthesis, higher harmonic content in the modulating waveform does not necessarily imply nor result in wider bandwidth in the modulated carrier. In nonlinearly synthesized MSK for example, application of a slew limited, triangular signal—rich in odd harmonics—results in step frequency changes between two values, with continuous phase at transition—exactly the same modulated carrier as results with MSK modulation by linear techniques, and hence occupies the same spectral bandwidth.

Phase Precision

A number of factors will affect the precision of the phase modulation. These are primarily component tolerance in the phase keyer and variations in the synthesizer division factor D. The worst case occurs for the nominal value of $\Phi_{nom.}=270°$ There are three sources of phase error in the phase keyer: the nominal RC (resistor capacitor) time constant, the keyed $\Delta$Rs and variations in FET $R_{DS}(on)$. For the component values shown in FIG. 9, an $R_{DS}(on)$ error of 100$\Omega$ introduces only about 1.1° of modulation phase error at the VCO. A ±1% fixed component tolerance plus the 100$\Omega$ $R_{DS}(on)$ error will introduce a total phase error of $-\Phi \leq \pm 4°$ statistically—±6.5° worst case.

In the present application, the proposed carrier frequency is in the range of 2 GHz with a total band of 40 MHz. To accommodate this, D will need to change by only ±1%. This will introduce a modulation phase error of ±1% which, at a nominal value of $\Phi_{nom}=270°$, is $\Delta\Phi \leq \pm 2.7°$.

The total phase error resulting from all these sources will be $\Delta\Phi \leq \pm 4.8°$ statistically and $\Delta\Phi \leq \pm 9.2°$ worst case. This will result in a finite, but tolerable crosstalk between the I and Q data channels of $\chi \leq \sin \Delta\Phi$, which for $\Delta\Phi \leq 9.2°$ equals −15.9 dB worst case. If the receiver of this signal is made to seek modified I and Q reference phases that are each orthogonal to the average of the interfering phase pair, (ignoring the X difference when taking the average) this number can be reduced to $$\chi \leq \frac{\sin\frac{\Delta\phi}{3}}{\cos\frac{\Delta\phi}{3}} = \tan\frac{\Delta\phi}{3}.$$

For $\Delta\Phi \leq 9.2°$ this equals −25.4 dB worst case, about 10 dB improvement.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A modulated oscillator having a radio-frequency output and a modulation input, the frequency or phase of the radio frequency output being controlled by a signal applied to the modulation input, comprising:

a voltage controlled oscillator having a radio-frequency ouptput and a control input, the frequency of the radio-frequency output being controlled by the voltage applied to the control input, a detector having first and second inputs and an error output, the error output comprising a voltage related to the frequency or phase difference between the signals present at the first and second inputs;

a referene oscillator having a radio-frequency output coupled to the first input of the detector;

the second input of the detector being coupled to the radio-frequency output of the voltage-controlled oscillator, the coupling of the radio-frequency output of the voltage controlled oscillator to the second input of the detector comprising a feedback path;

the error output of the detector being coupled to the control input of the voltage controlled oscillator, the coupling of the error output of the detector to the control input of the voltage controlled oscillator comprising an error path;

such that the error output of the detector is related to the phase or frequency difference between the signal present at the radio-frequency ouptput of the voltage controlled oscillator and the radio-frequency output of the reference oscillator;

the referene oscillator, voltage controlled oscillator, and detector, and the error path and feedback path comprising a phase-locked loop;

the voltage on the error path and the radio-frequency signal on the feedback path comprising a feedback signal in the phase-locked loop, such that the radio frequency output of the modulated oscillator is controlled by the phase-locked loop through the feedback signal, and a keyed phase shift network in the feedback path of the phase-locked loop between the radio-frequency output of the voltage-controlled oscillator and the second input of the detector, having at least one switching control input coupled to the modulation input such that a signal at a switching control input of the keyed phase shift network causes a phase shift of a predetermined amount;

the keyed phase shift network comprising:
  a capacitor having a first end coupled to the second input of the detector and a second end connected to ground;
  a first resistor having a first end and a second end, the second end being coupled to the first end of the capacitor;
  a second resistor having a first end coupled to the radio-frequency output of the voltage-controlled oscillator and a second end coupled at a common point to the first end of the first resistor;
  switching means for making or breaking a connection in response to a signal present at the switching control input, having a first terminal coupled to the radio-frequency output of the voltage controlled oscillator and a second terminal coupled to the common point of the first and second resistors, such that a signal on the switching control input causes the switching means to change conductive state, shunting the second resistor;
  the values of the first and second resistors and the capacitor being chosen such that introducing a signal at the switching control input of the switching means, causing the switching means to shunt the second resistor, introduces a change in phase shift of a predetermined value.

2. The modulated oscillator of claim 1, in which the differential phase shift $\theta$ is determined by $\theta=\Delta\Omega=-\tan^{-1}+\tan^{-1}$ where $\omega_{ref}$ is the frequency of the radio-frequency output of the reference oscillator, $R_1$ is the value of the first resistor, and $R_2$ is the value of the second resistor, and C is the value of the capacitor.

3. The modulated oscillator of claim 1 in which the switching means is a field effect transistor.

4. A modulated oscillator having a radio-frequency output and a modulation input, the frequency or phase of the radio frequency output being controlled by a signal applied to the modulation input, comprising:
  a voltage controlled oscillator having a radio-frequency output and a control input, the frequency of the radio-frequency output being controlled by the voltage applied to the control input,
  a detector having first and second inputs and an error output, the error output comprising a voltage related to the frequency or phase difference between the signals present at the first and second inputs;
  a reference oscillator having a radio-frequency output coupled to the first input of the detector;
  the second input of the detector being coupled to the radio-frequency output of the voltage-controlled oscillator, the coupling of the radio-frequency output of the voltage controlled oscillator to the second input of the detector comprising a feedback path;
  the error output of the detector being coupled to the control input of the voltage controlled oscillator, the coupling of the error output of the detector to the control input of the voltage controlled oscillator comprising an error path;
  such that the error output of the detector is related to the phase or frequency difference between the signal present at the radio-frequency output of the voltage controlled oscillator and the radio-frequency output of the reference oscillator;
  the referne oscillator, voltage controlled oscillator, and detector, and the error path and feedback path comprising a phase-locked loop;
  the voltage on the error path and the radio-frequency signal on the feedback path comprising a feedback signal in the phase-locked loop, such that the radio frequency output of the modulated oscillator is controlled by the phase-locked loop through the feedback signal, and
  a keyed phase shift netowrk in the feedback path of the phase-locked loop between the radio-frequency output of the voltage-controlled oscillator and the second input of the detector, having at least one switching control input coupled to the modulation input such that a signal at a switching control input of the keyed phase shift network causes a phase shift of a predetermined amount;
  the keyed phase shift network being a differential phase shift keyer havng a plurality of switching control inputs, such that a plural;ity of phase shifts may be introduced by combinations of signals at the plurality of inputs, in which the keyed phase shift network comprises:
    a capacitor having a first end coupled to the second input of the detector and a second end connected to ground;
    a first resistor having a first end and a second end, the second end being coupled to the first end of the capacitor;
    a plurality of $\Delta R$ networks connected in series, each having a signal path input and a signal path output and a switching control input, the signal path input of the first $\Delta R$ network being coupled to the radio frequency output of the voltage-controlled oscillator, the output of the last $\Delta R$ network being coupled to the first end of the first resistor of the phase shift keyer, the switching control input of each $\Delta R$ network being coupled to one of the plurality of switching control inputs of the phase shift keyer, each $\Delta R$ network comprising:
      a shift resistor having a first end coupled to the signal path input of the $\Delta R$ network and a second end coupled to the signal path output of the $\Delta R$ network;
      switching means means for making or breaking a connection in response to a signal present at the switching control input, having a first terminal coupled to the first end of the shift resistor and a second terminal coupled to the second end of the shift resistor, such that a signal on the switching control input causes the switching means to change conductive state, shunting the shift resistor;
      the values of the shift resistors of the $\Delta R$ networks, the first resistor of the phase shift keyer and the capacitor being chosen such that introducing one or more signals at the switching control inputs of the plurality of $\Delta R$ networks causes the switching means of the plurality of $\Delta R$ networks to shunt their respective shift resistors, thus introducing a plurality of phase shifts of predetermined value.

5. The modulated oscillator of claim 4, in which there are two AR networks, and there are four phase shifts of predetermined value chosen such that introducing two signals into the two switching control inputs results in quadrature keying of the output of the voltage controlled oscillator.

6. The modulated oscillator of claim 4, in which the switching means of the AR networks comprises a field-effect transistor.

7. The modulated oscillator of claim 4, in which the AR networks further comprise an additional resistor in series with the switching means.

8. A modulated oscillator having a radio-frequency output and a modulation input, the frequency or phase of the radio frequency output being controlled by a signal applied to the modulation input, comprising:

a voltage controlled oscillator having a radio-frequency output and a control input, the frequency of the radio-frequency output being controlled by the voltage applied to the control input, a detector having first and second inputs and an error output, the error output comprising a voltage related to the frequency or phase difference between the signals present at the first and second inputs;

a reference oscillator having a radio-frequency output coupled to the first input of the detector;

the second input of the detector being coupled to the radio-frequency output of the voltage-controlled oscillator, the coupling of the radio-frequency output of the voltage controlled oscillator to the second input of the detector comprising a feedback path;

the error output of the detector being coupled to the control input of the voltage controlled oscillator, the coupling of the error output of the detector to the control input of the voltage controlled oscillator comprising an error path;

such that the error output of the detector is related to the phase or frequency difference between the signal present at the radio-frequency output of the voltage controlled oscillator and the radio-frequency output of the reference oscillator;

the reference oscillator, voltage controlled oscillator, and detector, and the error path and feedback path comprising a phase-locked loop;

the voltage on the error path and the radio-frequency signal on the feedback path comprising a feedback signal in the phase-locked loop, such that the radio frequency output of the modulated oscillator is controlled by the phaselocked loop through the feedback signal, and a phase shift keyer in the error path between the error output of the detector and the control input of the voltage controlled oscillator, having at least one switching control input coupled to the modulation input such that a signal at a switching control input of the phase-shift keyer injects a perturbation into the error path of the phase locked loop, causing a phase shift of a predetermined amount in the radio-frequency output of the voltage controlled oscillator.

9. The modulated oscillator of claim 8, in which the phase-shift keyer comprises a keyed voltage divider having a switching control input, a reference input coupled to a fixed DC reference voltage and a switched output, such that a signal on the switching control input causes a voltage of at least one fixed value to appear at the switched output, such that a signal at the switching control input causes a perturbation of the error voltage on the error path related to the fixed voltage value, causing a phase shift of a predetermined amount in the radio-frequency output of the voltage controlled oscillator.

10. The modulated oscillator of claim 8, in which the cumulative phase of the modulated radio-frequency output of the voltage controlled oscillator is restricted to a predetermined range.

11. The modulated oscillator of claim 10, in which the cumulative phase of the radio-frequency output of the voltage controlled oscillator is restricted to a range of 2x.

12. The modulated oscillator of claim 8, in which the frequency of the radio frequency output of the reference oscillator is less than the frequency of the radio-frequency output of the voltage controlled oscillator, and the phase-locked loop further comprises divider means for dividing the frequency of a signal, the divider means being in the feedback path between the radio frequency output of the voltage controlled oscillator and the second input of the detector.

13. The modulated oscillator of claim 12, in which the cumulative phase of the modulated radio-frequency output of the voltage controlled oscillator is restricted to a predetermined range.

14. The modulated oscillator of claim 13, in which the cumulative phase of the radio-frequency output of the voltage controlled oscillator is restricted to a range of $2\pi$.

15. The modulated oscillator of claim 14, in which one is added to the count in the divider when the cumulative phase rolls over from 0 to $$-\frac{3\pi}{2}.$$

16. The modulated oscillator of claim 14, in which one is subtracted from the count in the divider when the cumulative phase rolls over from $$-\frac{3\pi}{2}$$

to 0.

17. A method of generating an RF carrier which is frequency or phase modulated by a modulating signal, the RF carrier being generated by a phase-locked loop oscillator having an RF output and frequency control means including a feedback path having an error voltage, the method comprising introducing a shift in the phase of the error voltage in the feedback path of the phase-locked loop in response to the modulating signal.

18. The method of claim 17, in which the modulating signal is chosen such that RF output is quadrature phase-shift keyed.

19. The method of claim 17, in which the RF output of the oscillator is connected directly to an antenna.

20. A phase-shift modulator for radio-frequency oscillators of the kind comprising a voltage controlled oscillator having a radio-frequency output and a control input, the frequency of the radio-frequency oiutput being controlled by the voltage applied to the control input, a detector having first and second inputs and an error output, the error output comprising a voltage related to the frequency or phase difference between the signals present at the first and second inputs; a reference oscillator having a radio-frequency output coupled to the first input of the detector; the second input of the detector being coupled to the radio-frequency output of the voltage-controlled oscillator, the coupling of the radio-frequency outpt of the voltage controlled oscillator to the second input of the detector comprising a feedback path; the error outpuit of the detector being coupled to the control input of the voltage controlled oscillator, the coupling of the error output of the detector to the control input of the voltage controlled oscillator comprising an error path; such that the error output of the detector is related to the phase of frequency difference between the signal present at the radio-frequency output of the voltage controlled oscillator and the radio-frequency output of the reference oscillator; the reference oscillator, voltage controlled oscillator, and detector, and the error path and feedback path comprising aphaselocked loop; the voltage on the error path and the radio-frequency signal on the feedback path comprising a feedback signal in the phase-locked loop, such that the radio frequency output of the modulated oscillator is controlled by the phase-locked loop through the feedback signal; the modulator comrpising phase-shift network means for introducing the modulsting signal as a keyed perturbation of the error voltage in the error path in respnse to the modulating signal.

21. The modulator of claim 20, in which the modulating signal is chosen such that RF output is quadrature phase-shift keyed.

22. A modulated oscillator having a radio-frequency output and a modulation input, the frequency or phase of the radio frequency outptu being controlled by a signal appleied to the modulation inpout, comprising:

- a voltage controlled oscillator having a radio-frequency output and a control input, the frequency of the radio-frequency output being controlled by the voltage applied to the control input,
- a detector having first and secod inputs and an error output, the error output comprising a voltage related to the frequency or phase difference between the signals present at the first and second inputs;
- a referene oscillator having a radio-frequency output coupled to the firs input of the detector; the frequency of the radio frequency output of the reference oscillator being less than the frequency of the radio-frequency output of the voltage controlled oscillator,
- the second input of the detector being coupled to the radio-frequency output of the voltage-controlled oscillator, the coupling of the radio-frequency output of the voltage controlled oscillator to the second input of the detector comprising a feedback path;
- divider means for dividing the frequency of a signal, the divider means being in the feedback path betwen the radio-frequency output of the voltage controlled oscillator and the second input of the detecotr,
- the error output of the detector being coupled to the control input of the voltage controlled oscillator, the coupling of the error output of the detector to the control input of the voltage controlled oscillator comprising an error path;
- such that the error output of the detector is related to the phase or frequency difference betwen the signal present at the radio-frequency outptu of the voltage controlled oscillator and the radio-frequency output of the reference oscillator;
- the refrenc eoscillator, voltage controlled oscillator, and detector, and the error path and feedback path comrpissing a phse-locked loop;
- the voltage on the error path and the radio-frequency signal on the feedback path comprising a feedback signal in the phase-locked loop, such that the radio frequency output of the modulated oscillator is controlled by the phase-locked loop throgh the feedback signal,
- a keyed phase shift network in the feeeback path of the phase-locked loop between the radio-frequency out-pout of the voltage-cpntrolled oscillator and the second input of the detector, having at least one switching control input coupled to the modulation input such that a signal at a switching control input of the keyed phase shift network causes a phase shift of a predetermined amount;
- the cumulative phase of the modulated radio-frequency output of the voltage controlled oscillator is resitrcited to a predetermined range of $2\pi$ by adding to or subtracting from the count in the divider when the cumu-l;ative phase rolls over.

23. The modulated oscillator of claim 22, in which one is added to the count in the divider when the cumulative phase rolls over from 0 to $$-\frac{3\pi}{2}.$$

24. The modulated oscillator of claim 22, in which one is subtracted from the count in the divider when the cumulative phase rolls over from $$-\frac{3\pi}{2}$$

to 0.

* * * * *